United States Patent [19]

Parker

[11] Patent Number: 5,231,356
[45] Date of Patent: Jul. 27, 1993

[54] FLEXIBLE BATTERY TESTER WITH A VARIABLE LENGTH RESISTIVE HEATER

[76] Inventor: Robert Parker, 411 Rolling Hills La., Alamo, Calif. 94301

[21] Appl. No.: 899,371

[22] Filed: Jun. 16, 1992

[51] Int. Cl.$^5$ .......................................... G01N 27/416
[52] U.S. Cl. ............................... 324/435; 324/427; 324/104; 324/106; 340/636; 359/44
[58] Field of Search ............... 324/426, 427, 429, 435, 324/104, 105, 106; 340/636; 320/48; 359/44

[56] References Cited

U.S. PATENT DOCUMENTS

| | | | |
|---|---|---|---|
| 4,006,414 | 2/1977 | Parker | 324/106 |
| 4,702,563 | 10/1987 | Parker | 359/44 |
| 4,702,564 | 10/1987 | Parker | 359/44 |
| 4,723,656 | 2/1988 | Kiernan et al. | 324/104 X |
| 4,726,661 | 2/1988 | Parker | 359/44 |
| 4,737,020 | 4/1988 | Parker | 359/44 |
| 4,835,475 | 5/1989 | Hanakura et al. | 324/435 |
| 4,835,476 | 5/1989 | Kurosawa | 324/435 |
| 5,059,895 | 10/1991 | Cataldi et al. | 324/104 |
| 5,128,616 | 7/1992 | Palmer | 324/435 |

FOREIGN PATENT DOCUMENTS

8600282 9/1987 Netherlands .

*Primary Examiner*—Jack B. Harvey
*Assistant Examiner*—Glenn W. Brown
*Attorney, Agent, or Firm*—Paul Hentzel

[57] ABSTRACT

A thermo-responsive device for testing dc voltage sources, particularly small, low voltage dry cells, employs a very thin resistive heater film deposited onto a thin flexible dielectric substrate. During testing the ends of the resistive film engage the pole terminals of the battery. Current from the battery flows through the resistive film and uniformly heats the substrate by resistance heating, causing a series of thermo-responsive elements mounted on the substrate to undergo visual "temperature events" at progressively higher temperatures. The resistive film is uniform in thickness and uniform in sheet resistivity. The current density and resistive heating of the film is therefore uniform throughout the substrate and the thermo-responsive elements. The uniform heating permits the thermo-responsive elements to be mounted anywhere on the substrate. The length of the resistive heater may be varied to vary the heating current and the heating temperature. The atomic thickness of the resistive film increases the crease resistance of the film and reduces the effects of bending fatigue.

40 Claims, 6 Drawing Sheets

FLEXIBLE BATTERY TESTER WITH A VARIABLE LENGTH RESISTIVE HEATER

TECHNICAL FIELD

This invention relates to battery testers, and more particularly to such testers employing a variable length resistive heater on a substrate for heating a thermo-responsive indicator.

BACKGROUND

Heretofore, flexible testers for small batteries employed finite conductive layers having a greater than atomic thickness which were adversely affected by repeated cycles of extreme bending. In addition, these earlier conductive layers were tapered for creating a test current density gradient which produced a test equilibrium temperature gradient along the substrate. A "hot spot" at the nip of the taper where the current density was the highest limited the dynamic range of the conductive layers. These earlier testers did not have a uniform test current density or a uniform test equilibrium temperature.

Long testers with smaller temperature gradients were generally more accurate than shorter testers with higher temperature gradients. The testers employed a single thermochromic indicator mounted along the temperature gradient next to a status scale. The thermochromic had a single response temperature. The user determined the status of the battery by observing the point on the scale where the increasing equilibrium temperature along the temperature gradient was equal to the fixed response temperature of the thermochromic. There was no provision in these prior art devices for varying the length of the conductive layers in order to control the resulting current density.

The placement of the thermochromic indicator along the temperature gradient also affected the accuracy of the testing. Mis-registration between the indicator and the temperature gradient caused the indicator to respond late in the test cycle resulting in an under evaluation of the battery strength.

U.S. Pat. No. 4,006,414 issued on Feb. 1, 1977 to Robert Parker teaches a tapered conductive metallic foil for heating the visual indicator. U.S. Pat. No. 4,702,563 issued on Oct. 27, 1987, and U.S. Pat. No. 4,702,564 issued on Oct. 27, 1987, and U.S. Pat. No. 4,726,661 issued on Feb. 23, 1988, all to Robert Parker; teach a tapered epoxy conductor printed or painted on the substrate of the tester. U.S. Pat. No. 4,835,475 issued on May 30, 1989 to Hanakura shows a dry battery tester with a conductive heater and thermochromic layer on a film base.

SUMMARY

It is therefore an object of this invention to provide a generally uniform watt density variable length resistive heater type battery tester.

It is another object of this invention to provide such a battery tester which is environmentally stable and less expensive.

It is a further object of this invention to provide such a battery tester which has an increased dynamic operating range.

It is a further object of this invention to provide such a battery tester in which the thermo-responsive element need not be placed in registration along the conductive path.

It is a further object of this invention to provide such a battery tester which is very thin.

It is a further object of this invention to provide such a battery tester which is crease resistant.

Briefly, these and other objects of the present invention are accomplished by providing an elongated flexible dielectric substrate with a thin resistive heater deposited thereon. The resistive heater has a generally uniform sheet resistivity which conducts current from the battery source during testing for generating heat at a generally uniform watt density "W". An anode contact formed at one end of the heater is electrically connected to the anode terminal of the battery source during the testing. A cathode contact formed at the other end of the heater is electrically connected to the cathode terminal of the battery source. At least one of the contacts has an elongated contact area for permitting the user to vary the effective length of the resistive heater means during the testing causing the test current and test temperature to change. A thermo-responsive means secured to the substrate member is optically responsive to the heat generated by the battery current flowing in the resistive heater for indicating the status of the battery.

BRIEF DESCRIPTION OF THE DRAWING

Further objects and advantages of the present tester and the operation of thermo-responsive elements will become apparent from the following detailed description and drawing (not drawn to scale) in which.

The elements of the invention are designated by two digit reference numerals. The first digit indicates the Figure in which that element is first disclosed or is primarily described. The second digit indicates like features and structures throughout the Figures. Some reference numerals are followed by a letter which indicates a sub-portion or feature of that element.

GENERAL DESCRIPTION—(FIG. 1 A-D)

Battery tester 10 (FIG. 1A and 1B) is formed by an elongated dielectric substrate member 12, a very thin resistive heater 14 uniformly printed or deposited over the undersurface of the substrate, and thermo-responsive elements 16 secured somewhere along the over-surface of the substrate. The tester is held against the voltage source to be tested such as dry cell 18, with anode contact 14A at one end of the heater engaging battery anode pole terminal 18A; and with cathode contact 14C at the other end of the heater engaging battery cathode pole terminal 18C.

During testing a small battery current flows through the resistive heater from the anode contact to the cathode contact for establishing a predetermined "test" load on the battery. The test load current "I" and resulting watt density "W" is determined by the test voltage relationship (see FIG. 1D):

$$W = V^2/rL^2$$

where
  W is the watt density generated by heater 14 in watts/square cm,
  V is the test voltage of battery 18 under the test load current "I" in volts,
  r is the sheet resistivity of heater 14 in ohms/square, and
  L is the length of the heat generating current path along heater 14 in cm from terminal 14A to terminal 14C.

The test load current "I" uniformly heats the adjacent substrate and the thermo-responsive element. The thickness and width of the resistive heater are constant along the length forming part of the "r" term.

The thermo-responsive elements are suitable thermo-responsive materials such a three active regions 16L, 16M, and 16H (see FIG. 1C) secured to the substrate. The active regions define visible response stages of progressively higher response temperatures low, medium and high. If battery 18 is at the end of its service life and no longer can supply an adequate voltage under load, the test voltage "V" and the heater current (test load current "I") are low, resulting in a low heating temperature. Only the low temperature thermochromic region 16L shows an optical response. If battery 18 is in the middle of its service life, "V" and "I" have a medium value sufficient to cause both regions 16L and 16M to respond. If battery 18 is new, "V" and "I" are high and all three regions respond.

Figure 1A:
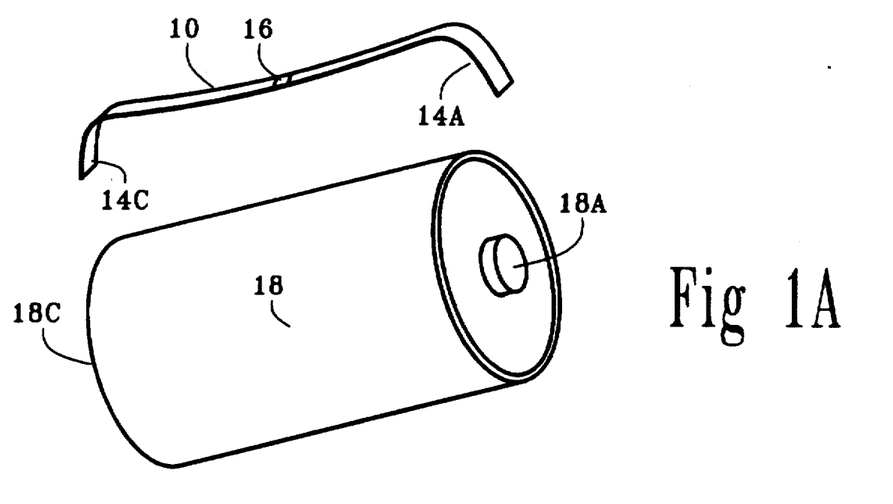
FIG. 1A is a perspective view of a battery tester and a voltage source to be tested.
Figure 1B:
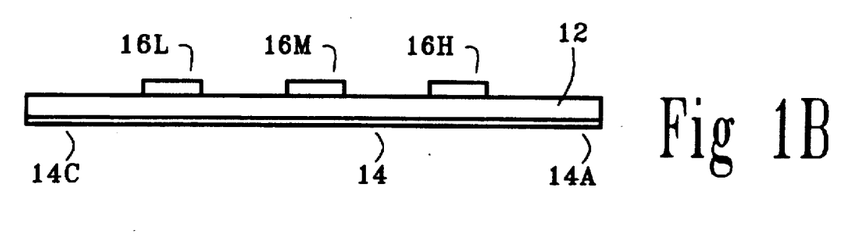
FIG. 1B is a side view of the tester of FIG. 1A.
Figure 1C:
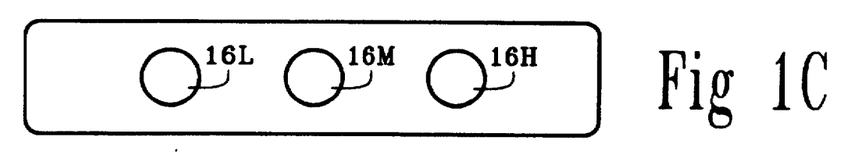
FIG. 1C is a plan view of the over-surface of the tester of FIG. 1A showing the thermo-responsive elements.
Figure 1D:
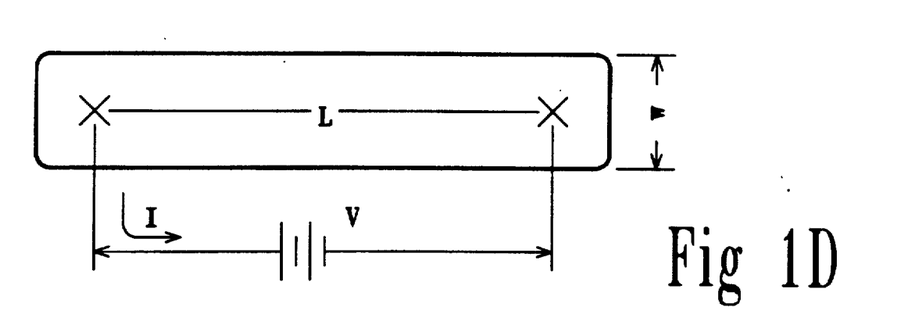
FIG. 1D is a plan view of the undersurface of the tester of FIG. 1A showing the resistive heater path.
Figure 3A:
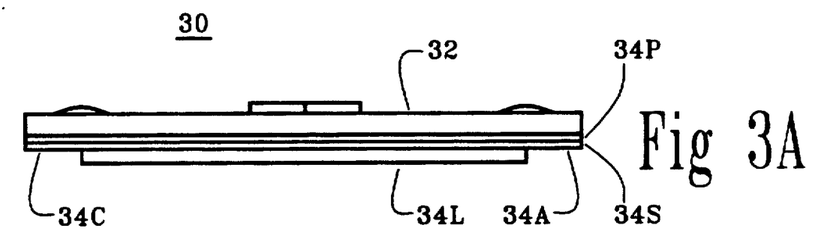
FIG. 3A is a side view of a battery tester with an insulative layer on the undersurface thereof.
Figure 3B:
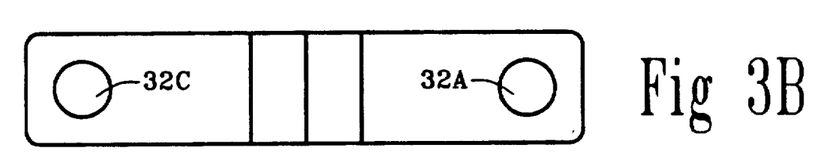
FIG. 3B is a plan view of the over-surface of the tester of FIG. 3A showing the finger pressure points for connecting the tester to a battery.
Figure 3C:
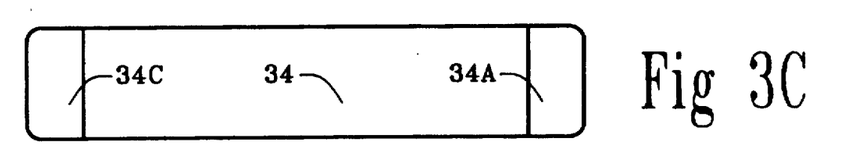
FIG. 3C is a plan view of the undersurface of the tester of FIG. 3A showing the anode and cathode contacts.

RESISTIVE HEATER 14 (FIG. 1B 3A)

Resistive heater 14 is formed by placing a suitable conductive material on to flexible dielectric substrate 12. The conductive material such as ink containing metal loaded polymers may be uniformly printed on the substrate. Alternatively, the conductive material may be evaporated into a chamber and atomically deposited onto the exposed surface of the substrate by a suitable evaporation technique such as vapor deposition or sputter deposition. Preferably the substrate is a wide sheet of substrate material supplied from a roll. A blocking aperture defines the deposition area on the sheet, and the speed of the substrate sheet movement passed the aperture precisely controls the deposition thickness of the film. The thickness and conductance of the film may be monitored during the deposition process to assure a uniform film. After applying the thermo-responsive substance by painting or printing in bands over the substrate sheet; the substrate is sliced down into individual elongated testers having the desired width and length "L". The width of the tester may be varied for increasing or decreasing the resistance of the film in order to obtain the required test current "I". A very short high resistance path may be employed having an even thinner conductive film which can be deposited at a faster substrate sheet speed.

The atomic nature of the deposition produces a uniform scratch resistant film intimately associated with the surface of the substrate. The homogeneous structure in the film provides environmental stability against humidity and temperature.

Stable metals with high electrical conductivity such as Cu, Al, Ag, Au, and Ni are preferred because only a very thin deposition of these metals is sufficient to form the resistive heater. For example, a Cu film has a sheet resistivity of from about 0.1 to about 1.0 ohms per square when deposited at a thickness of from about 2,000 to about 300 Angstrom units. These extremely thin films are less subject to bending fatigue caused by compression-tension bending cycles. Further, thin films require less metal, and can be deposited on the moving substrate at a higher throughput rate. Non-metallic materials such as carbon may also be deposited and used as the resistive heater film. Thinner films having a higher impedance of up to 2.0 ohms per square may be employed in order to decrease the length of the resistive heater.

A compound film (see FIG. 3A) may be formed by a soft, highly conductive primary film 34P, covered by a hard secondary film 34S which is less conductive. For example, 1,000 Angstroms of sputtered Cu may be covered by a vapor deposition of 200 Angstroms of SS (302 stainless steel) without significantly reducing the resistance of the Cu thereunder. The sheet resistivity of Cu is about fifty times the sheet resistivity of SS.

SUBSTRATE MEMBER 12 (FIG. 1B)

Substrate 12 may be a strong flexible dielectric such as a thin plastic polyester material or closed pore paper for carrying the resistive film. Preferably, the substrate is thin, from about 0.5 mils (0.0128 mm) to about 3.0 mils (0.0768 mm). Thin substrates have less thermal mass and therefore reach equilibrium temperature faster in response to the uniform heater current "I". The shorter response time yields a faster test cycle with minimum power drain from the battery. Further, thin substrates show less bending fatigue.

The tester may be mounted on the surface of the battery for testing and subsequent use. Thin substrates add less to the diameter of the battery thereby reducing interference problems with the service container during installation and removal of battery.

Figure 2A:
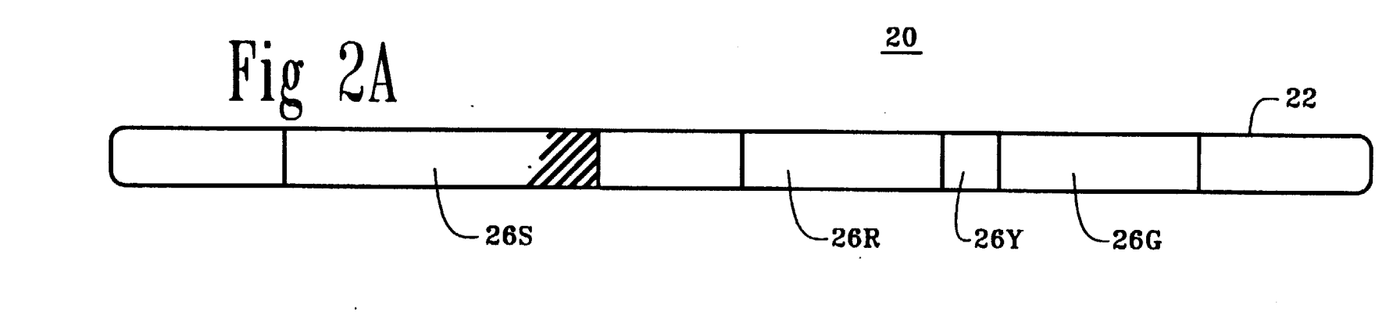
FIG. 2A is a plan view of a battery tester showing four adjacent thermo-responsive elements.
Figure 2B:
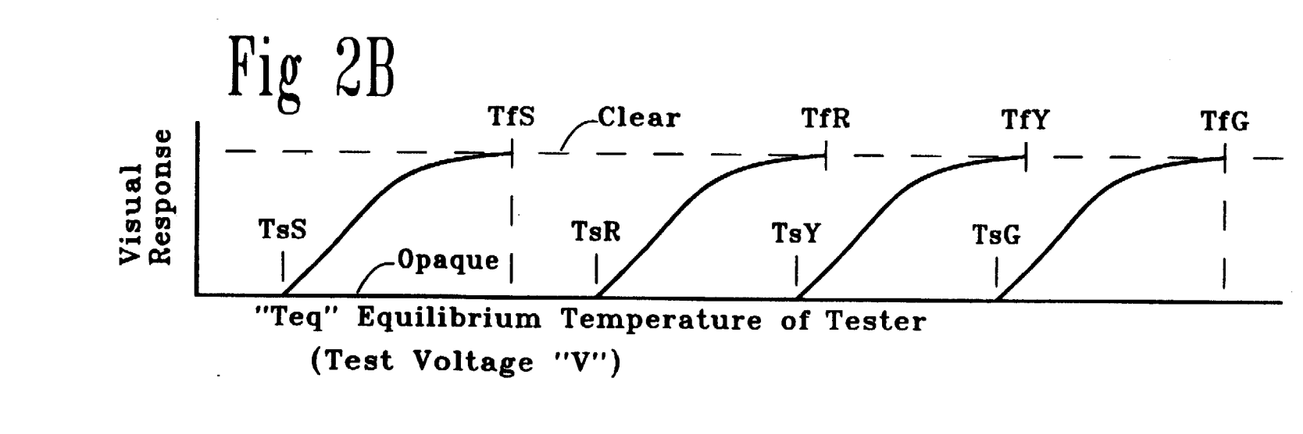
FIG. 2B is a graph of visible response verses temperature of thermo-responsive elements of FIG. 2A.

THERMO-RESPONSIVE INDICATOR 16 (FIG. 2A and 2B)

Thermo-responsive indicators 16 are carried by the substrate proximate the resistive heater, and may be any suitable reversible phase change substances which produce a visible temperature event when the substrate reaches a predetermined equilibrium temperature "Teq" due to the heat generated by the resistive heater. One group of such substances are thermochromic materials. Tester 20 (see FIG. 2A) has four sequential active regions 26S, 26R, 26Y and 26G of thermochromic materials which optically respond at progressively higher temperatures (see FIG. 2B). Each active region contains a dye or blanking material which is opaque at ambient temperature, and starts to clear at a start response temperature "Ts" to partially reveal a passive underlying feature such as a color or symbol painted on the over-surface of substrate 22. The dye becomes fully clear at a full response temperature "Tf" to fully reveal the underlying feature. The underlying color becomes visibly more intense as "Teq" passes from the lower "Ts" to the higher "Tf".

The "Ts" of each active region is higher then the "Ts" of the previous active region (from left to right). If desired, the "Ts" of each subsequent active region may be slightly lower than the "Tf" of the previous active region as shown in FIG. 2B, to provide an overlap in the sequential thermo-responses.

In the embodiment of FIG. 2A, the underlying features are colors—striped, red, yellow, and green. Red is in the low "Teq" range and indicates that the battery has a low test voltage "V" should be replaced. Yellow is in the middle "Teq" range and indicates that the battery is weak but serviceable. Green is in the high "Teq" range and indicates that the battery is new or at the beginning of its service life. The "Teq" is a function of the test voltage "V" under the test conditions, and is a reliable manifestation of the battery condition.

The user can determine the status of the battery by observing the number of colors revealed and by the intensity of the highest color. A new battery will show three colors at full intensity. An almost new battery will show red and yellow at full intensity and green at a lower intensity. A further, more subtle status indication is given by the intensity of the color along the open side edges of the indicator. A slight temperature gradient exists along the edges which cools slightly faster than the center. The edges of the indicator therefore have a slightly lower equilibrium temperature and reaches full brightness at a slightly higher voltage than the center of the indicator. The first sign of aging in a new battery is low intensity green margin appearing along the open edges. This early warning margin losses intensity and widens toward the center as the battery gets older.

Striped region 26S is a "connector" indicator which becomes visible at very low equilibrium temperatures "Teq". The striped region provides a "token" response for the very low "V" of nearly "dead" batteries which assures the user that he has made a valid pressure connection between the battery terminals and the tester contacts.

Another group of suitable phase change substances are mercury salts which change from yellow to orange at 50° C. (silver-mercury salt) and from red to black at 70° C. (copper-mercury salt) in response to increasing temperature. Atomic adjustment of the crystal lattice alters the absorption spectrum of the salt.

A further group of suitable phase change substances are liquid crystal materials which change through a sequence of colors (red-green-blue) in response to temperature. The molecular spacing within the crystal shifts causing scattering at progressively shorter wavelengths.

An additional group of suitable phase change substances are refraction scattering materials, which are white due to scattered reflected light when the refraction indexes do not match, and which become clear to reveal an underlying passive feature when the refraction indexes match. For example, three micron wax particles held within a cured silicone binder have mismatched refraction indexes at low temperatures. At higher temperatures, the wax melts forming a liquid with an index which matches the surrounding silicone. The incident light passes through the material and reflects back from the underlying color.

EQUILIBRIUM TEMPERATURE "Teq"

During testing, the test current "I" through the resistive heater causes the test temperature of the tester to increase from an ambient temperature "Tam" to the equilibrium temperature "Teq". At "Teq" the heat lost through the over-surface and undersurface of the tester is equal to the heat generated internally by the heater. A weak battery with a low "V" produces a low "I" and a low "Teq" which can not activate the green indicator. Heat loss from the vicinity of the indicators slows the rise of "Teq", causing an increase in the response time of the tester. Further, the absolute rise in test temperature from "Tam" to "Teq" is limited by the heat loss, and the sequential response temperatures of the indicators must be closer together on the temperature scale.

The two types of heat loss of concern are convective and conductive. Convective loss is heat flow from the over-surface of the tester into the ambient air and is typically minor. Air is a very good thermal insulator with a low thermal mass which is normally at room ambient temperature. Conductive loss is heat flow from the undersurface of the tester into the battery, and is typically many times larger than the convective heat loss. The surface of the battery is generally not as efficient an insulator as air. The adjacent body of the battery has a high thermal mass which may have a temperature lower than the room ambient temperature.

The conductive heat loss into the adjacent mass of the battery may be reduced by insulating the resistive heater from the surface of the battery. The portion of the tester carrying of the indicators may be raised away from the battery by providing an air gap 56G therebetween (see FIG. 5B and 5C). The air along the undersurface limits the conductive heat loss causing the test temperature to rise faster to a higher "Teq". An air gap of about 20 mils (or more) provides an adequate temperature change within and a workable response time. Alternatively, the conductive loss may by reduced by providing a suitable insulative thermal barrier under the indicators such as low density foam 66F (see FIG. 6A and 6B). Preferably barrier 66F is sufficiently compressible to permit insertion of the battery into the service container, and sufficiently resilient to return to the low density state when removed from the container for testing.

SHIELD LAYER 34L (FIG. 3 A-D)

Environmental protection for the resistive film may be provided by shield layer 34L formed over the film after deposition onto the substrate. Preferably, the shield is formed of a suitable dielectric material such as polyethylene or UV dielectric ink for electrically insulating the film from the battery housing 38H (see FIG. 3D). The small exposed region at each end of resistive heater film 34 (see FIG. 3C) is not covered by dielectric 34L, and defines electrical contacts 34A and 34C of tester 30. Pressure points 32A and 32C on the over-surface of substrate 32 (see FIG. 3B) are located at the preferred sites for application of contact pressure by the user during testing. If desired the pressure points may be identified by a suitable visual device such as colored dots. The center of the pressure points are directly over the end edge of the shield for assuring that area of engagement between tester contacts 34A and 34C and battery terminals 38A and 38C extends to the end edge of the shield (see FIG. 3D). The pressure point engagement limits the effective conductive path between the battery terminals to the film area covered by the shield. That is, the length of the shield corresponds to the length "L" of the resistive heater in the watt density relationship.

Figure 3D:
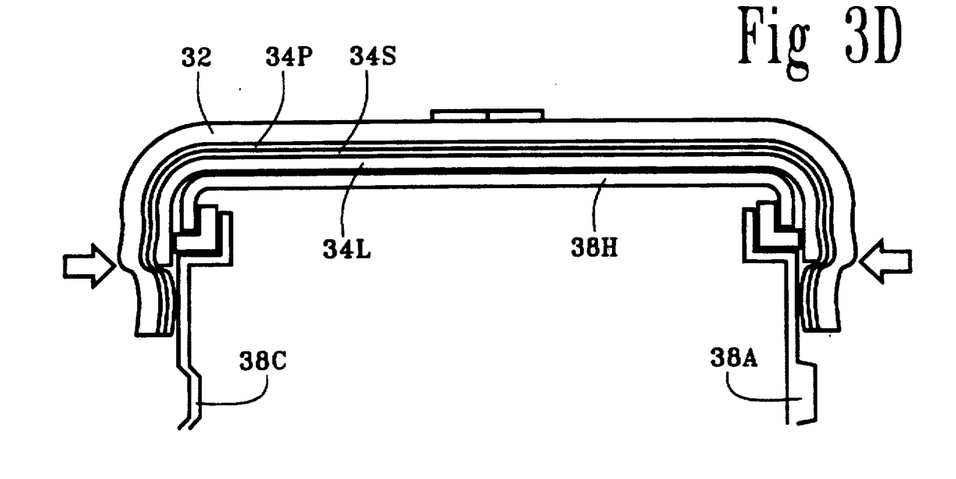
FIG. 3D is a fragmentary view in section of the tester of FIG. 3A showing electrical connection with the battery terminals.

If desired, the shield layer may include a suitable adhesive material for securing the tester to the housing of the battery (see FIG. 3D). The adhesive may be permanent for holding the tester to the housing for the life of the battery forming a unit. Alternatively, the adhesive may be reusable, permitting the user to remove the tester from the battery after the test. The tester may be shipped separate from the battery to be tested, and then permanently mounted on the battery or temporarily held against the battery during testing.

The tester may be mounted on the battery with either contact engaging the battery cathode terminal, and the remaining contact engaging the battery anode terminal. The tester is without polarity, and is completely reversible. The tester may have short contacts extending only part way over the battery terminals, so as not to interfere with electrical connection to the adjacent battery.

Figure 4A:
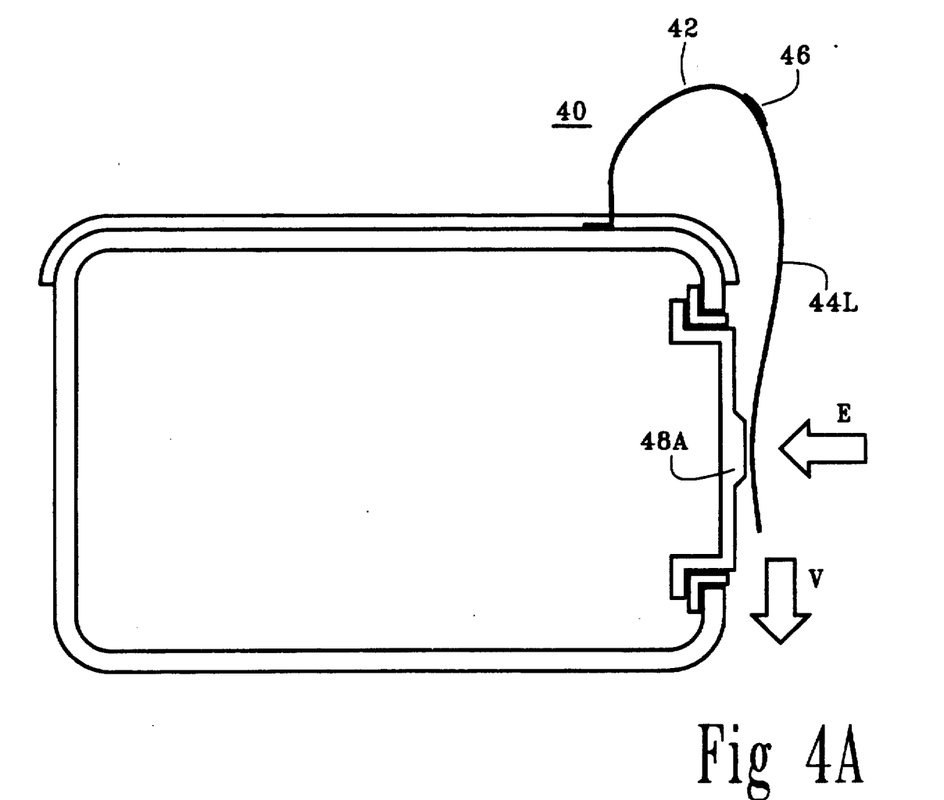
FIG. 4A is a side view in section of a sliding embodiment battery tester with a variable length resistive heater.
Figure 4B:
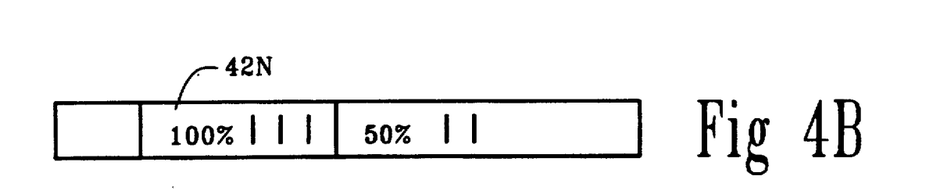
FIG. 4B is a plan view of the sliding embodiment tester of FIG. 4A showing a test number scale printed on the tester contact.
Figure 4C:
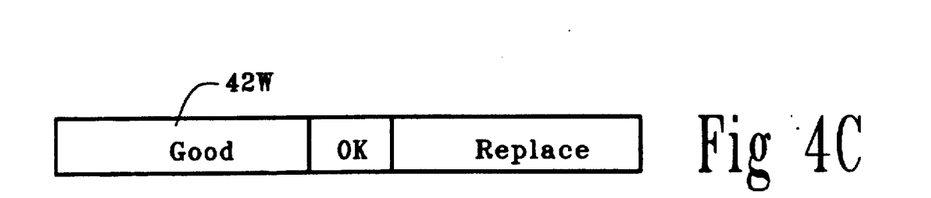
FIG. 4C is a plan view of the sliding embodiment tester of FIG. 4A showing condition words printed on the tester contact.

SLIDING CONTACT EMBODIMENT (FIG. 4)

The length of the conductive path for tester 40 may be varied by providing an extended lead contact 44L, and adjusting the engagement position of the contact with the battery terminal. The user presses contact 44L into engagement with battery terminal 48A (see FIG. 4A, arrow E). The sliding contact may be on the anode contact as shown, or on the cathode contact. The non-sliding contact is permanently secured by soldering or heat bonding to the other terminal. The user then slowly slides the extended contact through the engagement point by pulling the contact in the direction of arrow V, while monitoring a single temperature thermo-responsive element 46 mounted on substrate 42. Shortening the path length results in a shorter resistive heater with a higher test load current "I" and a higher watt density "W" resulting in a higher equilibrium temperature. Lengthening the path length produces a lower watt density "W" and a lower equilibrium temperature.

The user slowly decreases path length until the heater temperature reaches the response temperature of the thermo-responsive element. A fully charged battery with a high "V" (test voltage under load) will not require as much sliding as a used battery with a lower "V". A suitable number key 42N (see FIG. 4B) on the visible side of the long contact is scaled to various battery conditions. The number on the scale appearing next to the point of engagement when the thermo-responsive element first responds indicates the condition of the battery. Instead of numbers, word key 42W such as "Replace","OK", and "Good" may be printed on the contact (see FIG. 4C). Alternatively, a color scale may be employed such as red for replace, yellow for fair, and green for good.

FOLD-BACK RETAINERS (FIGS. 5A 5B 5C 6A and 6B)

Figure 5A:
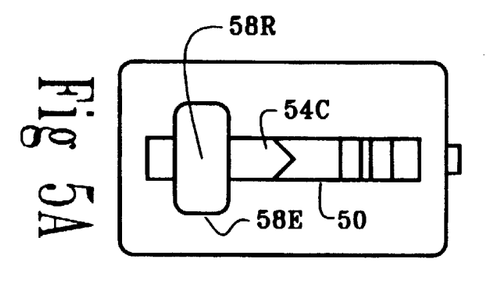
FIG. 5A is a plan view of a battery tester with a mechanical fold-back retainer in the storage position.
Figure 5B:
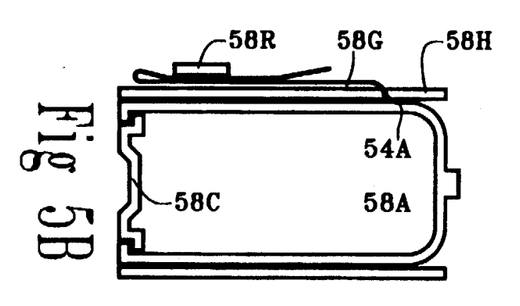
FIG. 5B is a side view in section of the battery tester of FIG. 5A.
Figure 5C:
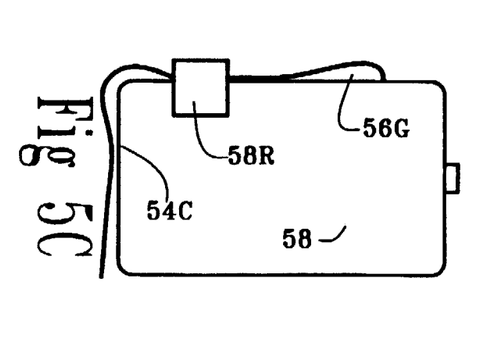
FIG. 5C is a side view of the tester of FIG. 5A with the fold-back retainer in the test position.

When a battery is in service or being stored, the movable end (or ends) of the tester may be held back in a non-test position by a suitable mechanical retainer such as retaining strap 58R (see FIG. 5A and 5B) secured to exterior housing 58H of the battery at each end portion 58E. If desired, tip contact 54C of tester 50 may be pointed to assist the user in slipping the tip under the retaining strap. In order to test the battery, the tip is pulled out from under the retainer and pressed against battery cathode terminal 58C in a test position (see FIG. 5C). Battery 58 shown in the embodiment of FIG. 5 is an alkaline type with anode metal jacket terminal 58A and a separate cathode base terminal 58C. Anode contact 54A of tester 50 extends through the exterior insulative housing for connection to the interior anode jacket. The tester is therefore secured to the battery at two places, at the anode jacket connection and at the retainer strap. An additional adhesive along the body of the tester is not required. The location of the anode connection along the anode jacket determines the length "L" of the resistive heater.

Figure 6A:
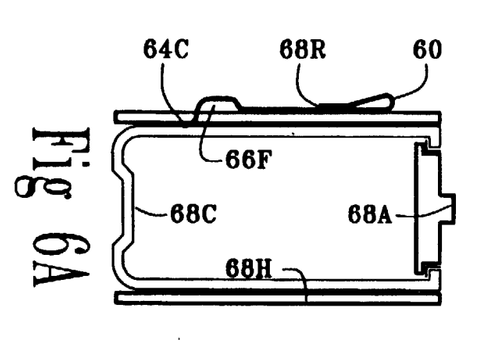
FIG. 6A is a side view in section of a tester with an adhesive fold-back retainer in the storage position.
Figure 6B:
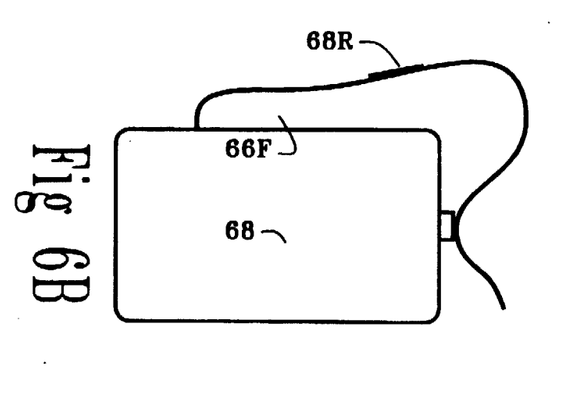
FIG. 6B is a side view of the tester of FIG. 6A with the fold-back retainer in the test position.

Alternatively, the movable end may be held back by a retaining adhesive 68R (see FIG. 6A) between the over-surface of tester 60 and the exterior housing 68H. The adhesive retainer may be a suitable reuseable adhesive such as an acrylic base material with negligible thickness. Battery 68 shown in the embodiment of FIG. 6 is a carbon-zinc type with cathode metal jacket 68C and separate anode cap 68A. Cathode contact 64C of tester 60 extends through the exterior insulative housing for connection to the interior cathode jacket.

Figure 7A:
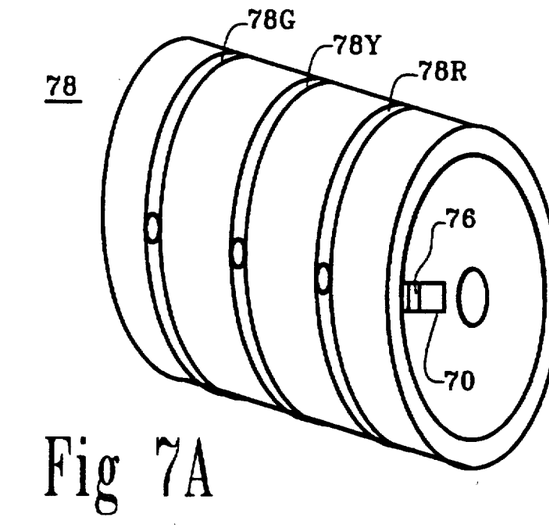
FIG. 7A is a perspective view of a multi-switch embodiment tester with a variable length resistive heater.
Figure 7B:
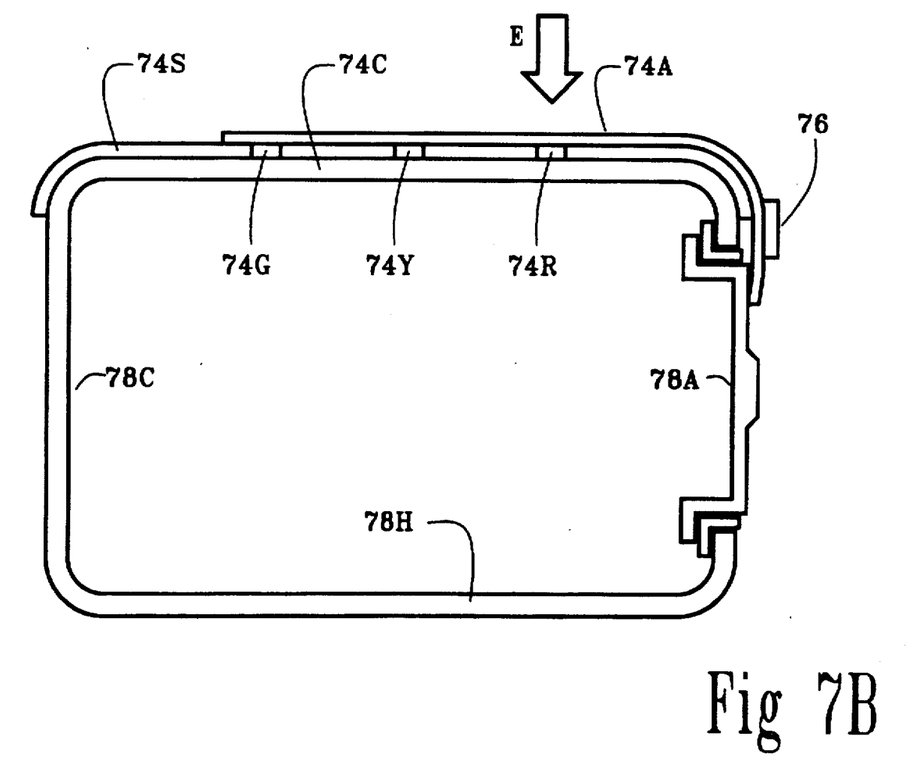
FIG. 7B is a sectional side view of the multi-switch embodiment tester of FIG. 7A.

MULTIPLE CONTACT EMBODIMENT (FIG. 7A and 7B)

Multiple effective lengths of the conductive path for tester 70 may be established by providing multiple push-to-close switches such as switch contacts 74R, 74Y, and 74G between anode terminal 78A and cathode terminal 78C. Elongated anode contact area 74A formed as part of the anode terminal extends over elongated cathode contact area 74C formed as part of the cathode terminal. Spacer 74S formed of a suitable dielectric material is positioned between the overlapping elongated contact areas for preventing electrical contact therebetween. The spacer has multiple voids therein, one for each of the multiple switches, where the overlapping contact areas are mutually exposed but spaced apart due to the resilience of the dielectric spacer material adjacent to each void.

The spacer defines a default non-test position in which the overlapping contact areas are not in electrical contact. The user pushes the overlying anode contact area into electrical engagement with the underlying cathode contact area defining one of multiple temporary test positions by selecting and pressing one of the switches (see FIG. 7B, arrow E). The overlapping contact areas are in electrical contact as long as the user maintains pressure on the selected switch establishing the selected effective length of the resistive heater means.

In the three test switch embodiment of FIG. 7, the spacer has three voids permitting the user to establish one of three effective lengths of the resistive heater which conducts one of three test currents. The first void forms switch 74G, and permits the user to establish the longest effective length which conducts the least test current for indicating a good status of the battery if the single temperature thermo-responsive device 76 responds to this first test current. The second void forms switch 74Y, and permits the user to establish a middle effective length which conducts a middle test current for indicating a fair status of the battery means if the thermo-responsive device responds to this second test current. The third void forms switch 74R, and permits the user to establish the shortest effective length which conducts the most test current for indicating a poor status of the battery means if the thermo-responsive device responds to this third test current.

Status indicators 78G (green), 78Y (yellow), and 78R (red) proximate the three voids are visible to the user during testing to indicate the status of the battery if the thermo-responsive means responds any of the three test currents. The colored indicators may be simple patches adjacent to the voids, or bands of color extending around the battery 78 as show in the embodiment of FIG. 7. In an embodiment with only two voids in the spacer permits the user to establish either of two effective lengths of the resistive heater which conducts either of two test currents.

The overlying contact may be anode contact 74A and the underlying contact may be cathode contact 74C, as shown in FIG. 7B. Alternatively, the overlying contact may be the cathode contact and the underlying contact may be the anode contact. Cathode contact 74C may be an integral part of the metal battery housing 78H as shown, or the cathode contact may additional conductive material connected to the housing. Permanent electrical contact is established between anode contact 74A and anode terminal 78A by a suitable conductive connector technique employing a heat bondable conductive material.

SPECIFIC EMBODIMENT

The following particulars of the battery tester are given as an illustrative example of resistive heater and response temperatures of the indicators. In this example: The battery source is a 1.5 volt "C" cell. Resistive Heater 14 is copper film having a sheet resistivity "r" of about 0.22 ohms/square, and a length of 2¼ inches (5.8 cm). Substrate 12 is 2 mil polyester. The low temperature thermochromic material has a response temperature of about 37 degrees C. for test voltages of from about 0.9 to about 1.1 volts. The middle temperature thermochromic material has a response temperature of about 45 degrees C. for test voltages of from about 1.1 to about 1.3 volts. The high temperature thermochromic material has a response temperature of about 53 degrees C. for test voltages greater then about 1.3 volts. The air gap between the tester and the battery surface is about 50 mils. The values, dimensions, material and temperatures given above are not intended as defining the limitations of the invention. Numerous other applications and configurations are possible.

INDUSTRIAL APPLICABILITY

It will be apparent to those skilled in the art that the objects of this invention have been achieved as described hereinbefore by providing an environmentally stable resistive heater formed by a metal conductive film which is less effected by ambient temperature and humidity. The accuracy of the present tester is not dependent on the length of the resistive heater because the temperature is uniform along the heater. The uniform equilibrium temperature increase the dynamic range of the present tester because by eliminating the "hot spot" found in earlier tapered testers. The uniform equilibrium temperature also permits the thermo-responsive device to be positioned anywhere along the heater. Thermal registration is not required. The thinness of the conductive film supports sharp bends and creasing without undue fatigue or alteration of the uniform sheet resistivity. The single thermochromic device has a small thermal sensitive area which minimizes the portion of the lead which is isolated from the ambient temperature of the battery body.

CONCLUSION

Clearly various changes may be made in the structure and embodiments shown herein without departing from the concept of the invention. For example the thermo-responsive indicator may be placed directly over the conductive film or on the opposite side of the substrate. Further, features of the embodiments shown in the various Figures may be employed with the embodiments of the other Figures.

Therefore, the scope of the invention is to be determined by the terminology of the following claims and the legal equivalents thereof.

I claim as my invention:

1. A resistive thermo-responsive device for permitting a user to test between the anode terminal and the cathode terminal of an electrical battery source for determining the charge status of the battery source, comprising:
    an elongated substrate member formed by a flexible dielectric material;
    a resistive heater means formed by a thin electrically conductive material on the substrate member for conducting a test current "I" from the battery source during testing which generates test heat for raising the temperature of the resistive heater means from an ambient temperature "Tam" to an equilibrium temperature "Teq";
    first contact means formed at one end of the resistive heater means for electrically engaging one of the terminals of the battery source during the testing:
    second contact means formed along the other end of the resistive heater means for electrically engaging the other one of the terminals of the battery source during the testing, having an elongated contact area for permitting the user to vary the effective length of the resistive heater means during the testing causing "I" and "Teq" to change; and
    thermo-responsive means carried on the substrate member proximate the resistive heater means between the first and second contact means, and optically responsive to the changing "Teq" of the resistive heater means for indicating the status of the battery source.

2. The device of claim 1, wherein the thermo-responsive means has an underlying visual feature means which indicates the status of the battery source, and the thermo-responsive means is opaque at the ambient temperature "Tam" of the resistive heater means to cover the underlying visual feature means and becomes clears in response to the equilibrium temperature "Teq" of the resistive heater means to reveal the underlying visual feature means.

3. The device of claim 2, wherein the underlying visual feature means is color.

4. The device of claim 2, wherein the thermo-responsive means is a single thermo-responsive device optically responsive to a single "Teq".

5. The device of claim 1, wherein resistive heater means has a generally uniform resistivity which produces a generally uniform watt density "W" determined by the voltage relationship:

$$W = V^2/rL^2$$

where
- W is the watt density generated within the resistive heater means,
- V is the test voltage of the battery source,
- r is the sheet resistivity of the resistive heater means, and
- L is the length of the heat generating current path along the resistive heater means which may be varied by the user during testing.

6. The device of claim 5, wherein the test voltage "V" varies from about 0.9 volt for a battery source having a weak status to about 1.55 volts for a battery source having a good status.

7. The device of claim 5, wherein the conductive material is conductive ink printed on the substrate member.

8. The device of claim 5, wherein the conductive material is a film formed on the substrate member by evaporation deposition.

9. The device of claim 8, wherein the conductive film is formed on the substrate member by vapor deposition.

10. The device of claim 8, wherein the conductive film is formed on the substrate member by sputter deposition.

11. The device of claim 8, wherein the sheet resistivity of the resistive heater means is from about 0.1 ohms per square to about 2.0 ohms per square.

12. The device of claim 8, wherein the conductive film is formed by at least one material selected from the group of materials consisting of Cu, Al, Ag, Au, Ni, stainless steel, and C.

13. The device of claim 8, wherein the conductive film is formed of Cu.

14. The device of claim 8, wherein the conductive film is a compound film comprising:
- a highly conductive primary film deposited on the substrate member; and
- a hard secondary film deposited on the primary film.

15. The device of claim 14, wherein the primary film is Cu; and the secondary film is stainless steel.

16. The device of claim 1, wherein the second contact means is movable relative to the other one of the terminals of the battery source for permitting the user to vary the point of electrical engagement between the elongated contact area of the second contact and the other one of the terminals in order to vary the effective length of the resistive heater means during testing.

17. The device of claim 16, wherein the second contact means has battery status indicia thereon in registration with the elongated contact area for indicating the status of the battery source.

18. The device of claim 1, wherein the elongated contact area of the second contact means has multiple possible electrical contact sites with the other terminal of the battery source for permitting the user to vary the effective length of the resistive heater means during testing.

19. A battery source unit which may be tested by a user to determine the charge status thereof, comprising:
- electrical battery means for supplying a test current during the testing, and having a first terminal means and a second terminal means one of which is the cathode of the battery means and the other of which is the anode of the battery means;
- housing means for the battery means;
- an elongated dielectric substrate member;
- a resistive heater means formed by a thin electrically conductive film deposited along the length of the substrate member for conducting the test current to establish a test temperature during testing, the resistive heater means having a first end and a second end;
- first contact means formed at the first end of the resistive heater means for electrical connection to the first terminal means of the battery means during testing;
- second contact means formed at the second end of the resistive heater means for electrical connection to the second terminal means of the battery means during testing, and having an elongated contact area for permitting the user to vary the effective length of the resistive heater means during the testing causing the test current and test temperature to change; and
- thermo-responsive means positioned on the substrate member proximate the resistive heater means between the first and second contact means, and having an active surface visible to the user during the testing which is optically responsive to the heat generated by the test current flowing in the resistive heater means.

20. The unit of claim 19, wherein the first contact means is permanently secured to the first terminal means of the battery means, and the second contact means is movable relative to the second terminal means of the battery means for making contact during the testing.

21. The unit of claim 20, wherein the first contact means is heat bonded to the first terminal means of the battery means by an electrically conductive bonding material.

22. The unit of claim 20, wherein the second contact means is movable relative to the second terminal means for permitting the user to vary the point of electrical engagement of the elongated contact area of the second contact means with the second terminal means in order to varying the effective length of the resistive heater means during testing.

23. The unit of claim 22, wherein the first terminal means is the cathode of the battery means and the second terminal means is the anode of the battery means, and the housing means forms the cathode of the battery means.

24. The unit of claim 22, wherein the second contact means has a test position in which the second contact means electrically engages the second terminal means during the testing, and a non-test position in which the second contact means does not electrically engage the second terminal means.

25. The unit of claim 24, further comprises a retainer means for retaining the second contact means in the non-test position.

26. The unit of claim 25, wherein the retainer means is a mechanical retainer for mechanically retaining the second contact means in a fold-back non-test position away from the second terminal means.

27. The unit of claim 25, wherein the retainer means is an adhesive retainer for adhesively retaining the second contact means in a fold-back non-test position away from the second terminal means.

28. The unit of claim 20, wherein the first contact means formed at the first end of the resistive heater means has an elongated contact area which overlaps the elongated contact area of the second contact means formed at the second end of the resistive heater means.

29. The unit of claim 28, further comprising spacer means formed of a dielectric material positioned between the overlapping elongated contact areas of the contact means for preventing electrical contact therebetween, the spacer means having at least one void therein where the overlapping contact areas are mutually exposed but spaced apart due to the dielectric spacer adjacent to the at least one void, defining a non-test position in which the overlapping contact areas are not in electrical contact.

30. The unit of claim 29, wherein the user may push the at least one void in the dielectric spacer means defining a test position in which the overlapping contact areas are in electrical contact and establish an effective length of the resistive heater means.

31. The device of claim 30, wherein the thermo-responsive means is a single thermo-responsive device optically responsive at a single test current flowing through the resistive heater means.

32. The unit of claim 31, wherein the spacer means has two voids permitting the user to establish either of two effective lengths of the resistive heater which conducts either of two test currents.

33. The unit of claim 32, further comprising indicator means proximate the two voids which are visible to the user during testing to indicate the status of the battery means if the thermo-responsive means responds to either of the two test currents.

34. The unit of claim 31, wherein the dielectric spacer has:
   a first void which permits the user to establish a longest effective length which conducts the least test current for indicating a good status of the battery means if the thermo-responsive device responds to the first void, and
   a second void which permits the user to establish a middle effective length which conducts a middle test current for indicating a fair status of the battery means if the thermo-responsive device responds to the second void, and
   a third void which permits the user to establish a shortest effective length which conducts the most test current for indicating a poor status of the battery means if the thermo-responsive device responds to the third void.

35. The unit of claim 34, further comprising green colored indicator proximate the first void, and a yellow colored indicator proximate the second void, and a red colored indicator proximate the third void.

36. The unit of claim 35, wherein the colored indicators are bands around the housing means.

37. The unit of claim 31, wherein the first terminal means is the cathode of the battery means and is formed by the housing means, and the second terminal means is the anode of the battery means, and the first contact area extends underneath the second contact area.

38. The unit of claim 19, further comprising a thermal barrier means between the battery means and the portion of the resistive heater means proximate the thermo-responsive means for thermally isolating the thermo-responsive means from the thermal mass of the battery means.

39. The unit of claim 38, wherein the thermal barrier mean is an air gap.

40. The unit of claim 38, wherein the thermal barrier means is a compressible resilient insulator material.

* * * * *